United States Patent [19]
Hunter

[11] Patent Number: 6,045,613
[45] Date of Patent: Apr. 4, 2000

[54] PRODUCTION OF BULK SINGLE CRYSTALS OF SILICON CARBIDE

[75] Inventor: Charles Eric Hunter, Hilton Head Island, S.C.

[73] Assignee: Cree, Inc., Durham, N.C.

[21] Appl. No.: 09/169,399

[22] Filed: Oct. 9, 1998

[51] Int. Cl.$^7$ .................................................. C30B 29/36
[52] U.S. Cl. ............................ 117/84; 117/99; 117/935; 117/951
[58] Field of Search .................. 117/84, 99, 104, 117/935, 951; 438/931

[56] References Cited

U.S. PATENT DOCUMENTS

| | | | |
|---|---|---|---|
| Re. 34,861 | 2/1995 | Davis et al. ............................ | 117/86 |
| 5,723,391 | 3/1998 | Hunter et al. ............................ | 501/86 |
| 5,858,086 | 1/1999 | Hunter ....................................... | 117/84 |
| 5,964,944 | 10/1999 | Sugiyama et al. ....................... | 117/107 |
| 5,985,024 | 11/1999 | Balakrishna et al. ..................... | 117/84 |

*Primary Examiner*—Benjamin L. Utech
*Assistant Examiner*—Donald L. Champagne
*Attorney, Agent, or Firm*—Richard S. Faust

[57] ABSTRACT

Bulk, low impurity silicon carbide single crystals are grown by deposition of vapor species containing silicon and vapor species containing carbon on a crystal growth interface. The silicon source vapor is provided by vaporizing liquid silicon and transporting the silicon vapor to a crystal growth crucible. The carbon vapor species are provided by either a carbon containing source gas (for example, CN) or by flowing the silicon source vapor over or through a solid carbon source, for example flowing the silicon vapor through porous graphite or a bed of graphite particles.

15 Claims, 4 Drawing Sheets

PRODUCTION OF BULK SINGLE CRYSTALS OF SILICON CARBIDE

FIELD OF THE INVENTION

The invention relates to the growth of semiconductor materials. More particularly, the invention relates to production of low defect density, low impurity bulk single crystals of silicon carbide for use in the electronics industry, as a diamond substitute, or other desired use.

BACKGROUND OF THE INVENTION

Silicon carbide (SiC) is rarely found in nature. It has, however, been manufactured for more than eighty years, in crystalline form, for abrasive products. Silicon carbide crystals found in nature and in abrasive products are generally black and not translucent because they contain substantial levels of impurity atoms.

In the 1950's the Lely process was developed at General Electric Company by which silicon carbide was sublimed and randomly deposited to produce small, thin silicon carbide crystals that were used in early silicon carbide semiconductor device development.

Because of the theoretically quite favorable electronic properties of silicon carbide, significant development activities were initiated during the 1960's and 1970's with the objective of growing large (bulk) crystals of low impurity silicon carbide for use in the production of semiconductor devices. These efforts finally resulted in the commercial availability of relatively low impurity, translucent silicon carbide crystals. These silicon carbide crystals are fabricated and marketed as very thin green, amber or blue (175 $\mu$m-400 $\mu$m) slices useful for semiconductor devices.

Recently, as discussed in U.S. Pat. No. 5,723,391, it has been discovered that relatively low impurity, translucent, single crystal silicon carbide may be grown with a desired color and thereafter fashioned by faceting and polishing into synthetic gemstones. These gemstones have extraordinary hardness, toughness, chemical and thermal stability, and a high refractive index and dispersion that produce unparalleled brilliance. The single crystals from which the gemstones are produced have been grown by sublimation according to techniques of the type described in U.S. Pat. No. Re. 34,061.

Silicon carbide crystals can be grown in a wide range of colors (including green, blue, red, purple, yellow, amber and black) and shades within each color by the appropriate selection of dopants (e.g., nitrogen and aluminum) and by varying the net doping densities (concentrations). Because of its wide bandgap, undoped ("intrinsic") silicon carbide crystals in the hexagonal or rhombohedral forms are inherently colorless. Thus, silicon carbide crystals offer the potential to be faceted and polished into gemstones of many various appearances, including that of relatively colorless diamond.

Because of the emerging recognition of the value of silicon carbide for electronics applications, synthetic gemstone applications, and otherwise, there has developed a need for improved processes for producing low defect density, low impurity bulk single crystals of silicon carbide.

SUMMARY OF THE INVENTION

The present invention enables one to reliably grow low defect density, low impurity bulk single crystals of silicon carbide.

The invention, in one basic aspect, is a method wherein vapor species containing Si and C necessary to grow bulk single crystalline silicon carbide are deposited on a seed crystal. The Si vapor species are provided by vaporizing silicon to produce a silicon source vapor. The carbon vapor species are provided either by injecting a carbon source gas into the system or by flowing the silicon source vapor through a porous carbon-containing solid, for example, porous graphite or a bed of graphite particles. The carbon source gas may take the form of CN mixed with an $N_2$ carrier.

BRIEF DESCRIPTION OF THE DRAWINGS

Some of the features of the invention having been stated, other features will appear as the description proceeds, when taken in connection with the accompanying drawings, in which—

DETAILED DESCRIPTION OF THE INVENTION

While the present invention will be described more fully hereinafter with reference to the accompanying drawings, in which aspects of the preferred manner of practicing the present invention are shown, it is to be understood at the outset of the description which follows that persons of skill in the appropriate arts may modify the invention herein described while still achieving the favorable results of this invention. Accordingly, the description which follows is to be understood as being a broad, teaching disclosure directed to persons of skill in the appropriate arts, and not as limiting upon the present invention.

Figure 1:
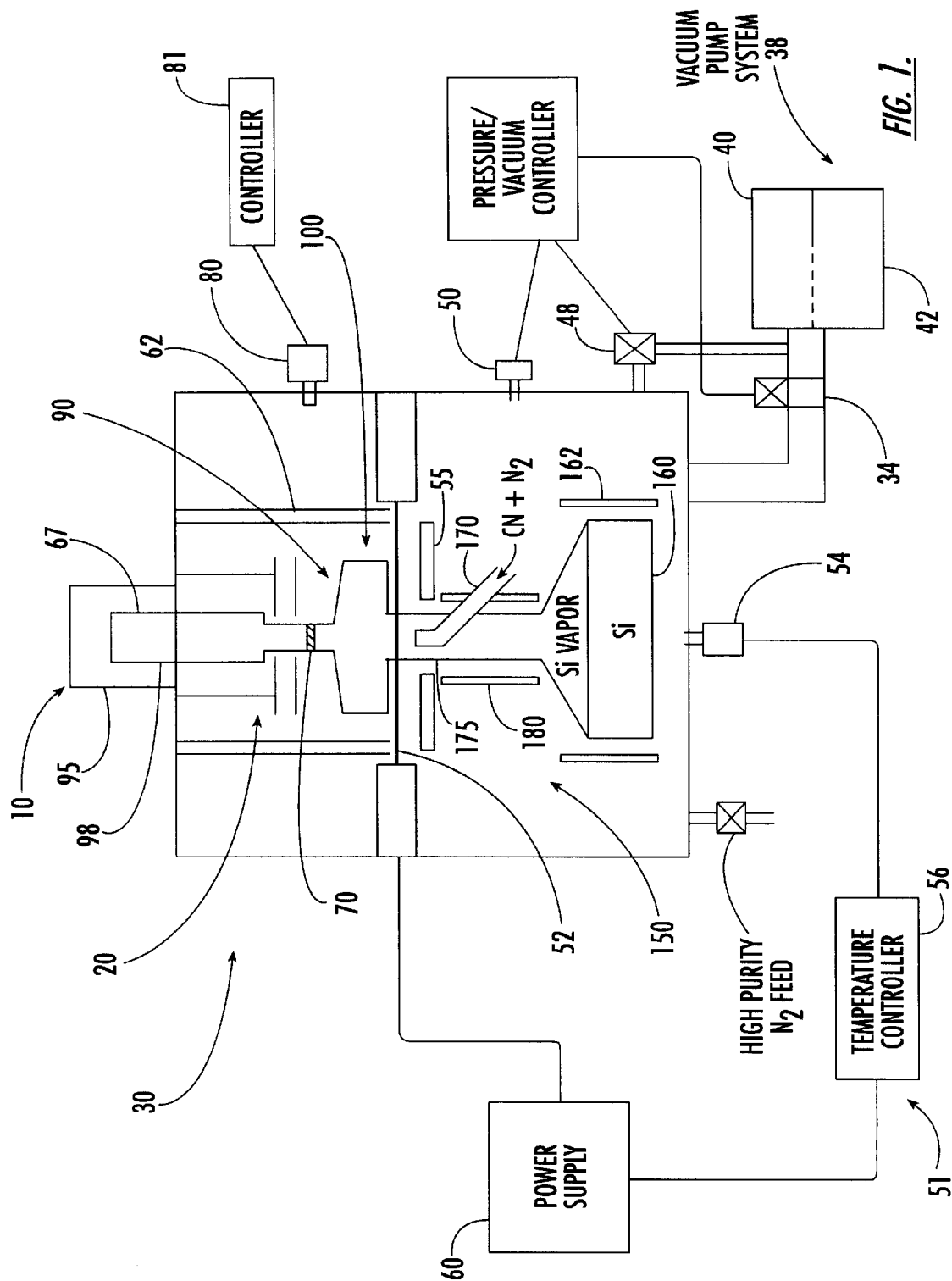
FIG. 1 is a schematic representation of one overall system for growing bulk single crystals of silicon carbide in accordance with the present invention.
Figure 2:
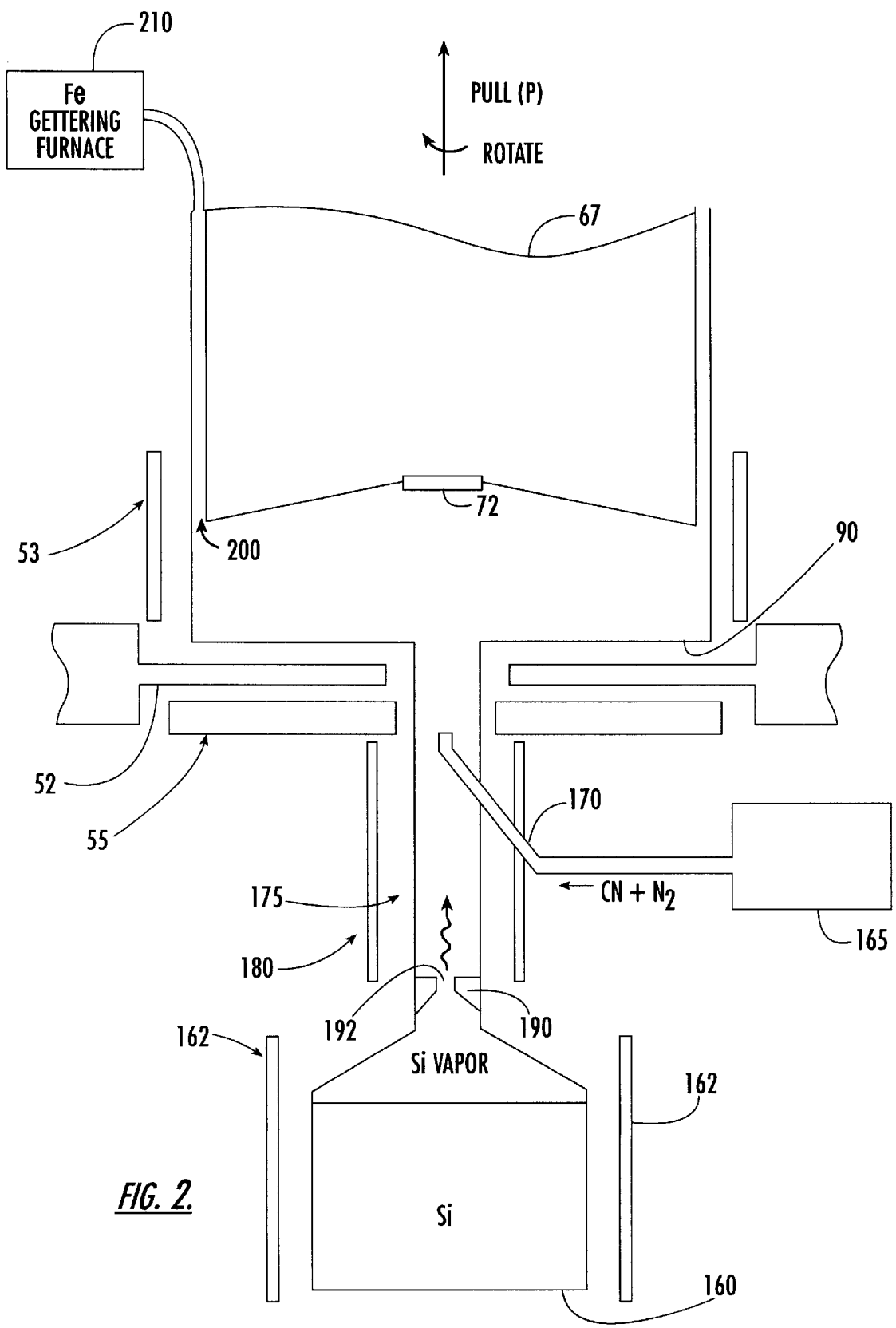
FIG. 2 is a side view of the crucible containing Si that is vaporized, the source of carbon-containing gas, the crystal growth enclosure containing a seed crystal, and related components of the crystal growth system of FIG. 1.

Referring to the drawings, and particularly to FIGS. 1 and 2, there is shown a schematic for the principal components of the overall system 10 for growing bulk single crystals of SiC according to the present invention. Growth system 10 includes a central subassembly generally indicated at 20. This subassembly incorporates a crystal growth enclosure in the form of a crucible 90, heating apparatus 51, thermal sink 67, seed holder 70, effusion system 100 and related structure, all of which serve to support the seed crystal and control the environment at the growing crystal interface during crystal growth operations. System 10 also includes a subassembly 150 for providing vapor species of Si and C to crucible 90. Subassembly 150 includes a lower crucible 160 that holds Si that is vaporized to provide Si source vapor and a gas injector 170 that injects source gas providing C source vapors. The Si and C source vapors are introduced into the bottom of crucible 90 by a conduit 175. Further details of subassemblies 20 and 150 will be described later in the specification.

A furnace chamber 30 encloses subassembles 20 and 150. Chamber 30 is fabricated from 316 stainless steel or other suitable material and is water cooled (detail not shown) according to principles well known in the art. System pressure within chamber 30 below 10 torr is controlled via a throttle valve 34 (for example, a 3 inch diameter throttle valve manufactured by MKS Instruments, Inc. of Andover, Mass., USA) located in series with a vacuum pumping system 38. In accordance with techniques known in the art, the vacuum pumping system 38 is composed of a mechanical pump 40 to reduce the system pressure to the $10^{-3}$ torr and a turbomolecular pump 42 to pump the system down to $10^{-5}$ torr. Pressure control above 10 torr is maintained through a magnetic control valve 48 that is also in series with vacuum pumping system 38. System pressure is measured from $10^{-3}$ torr to 1,000 torr with a highly accurate temperature controlled absolute capacitance manometer 50 such as the MKS Instruments, Inc., model no. 390.

Heat to system 10 is supplied by a resistance heating apparatus 51 including a horizontal thin plate heating element 52 and a cylindrical heating element 53, both of which may be formed of graphite or tungsten. Insulation 55 serves to protect the lower components of the system. Temperature control is facilitated by an optical pyrometer 54 (FIG. 1) sited on the back of heating element 52. Pyrometer 54 provides a constant input signal to a digital temperature controller 56 that maintains the temperature at a set point by controlling the output of a power supply 60. According to principles known in the art, heat generated by the heating elements is shielded from the stainless steel walls of chamber 30 by heat shields 62, preferably formed of graphite.

Regardless of the precise form taken by the horizontal plate heating element, such an arrangement enables the system to maintain a highly uniform thermal profile across a large diameter growing crystal interface allowing the growth of large diameter bulk single crystals and the use of a crucible having a very low ratio of height (H) to diameter (D).

The mechanism for aligning, supporting and transferring heat away from the seed crystal 72 includes a thermal sink 67 comprising a tube 68 that has a lip structure 70 at the bottom thereof for receiving the seed 72. Thermal sink 67 also includes a thermal sink rod 76 that is threaded into tube 68 and is tightened down upon the seed so as to press firmly upon the seed. Tube 68 and rod 76 are preferably formed of high density graphite having a very high thermal conductivity.

Figure 3:
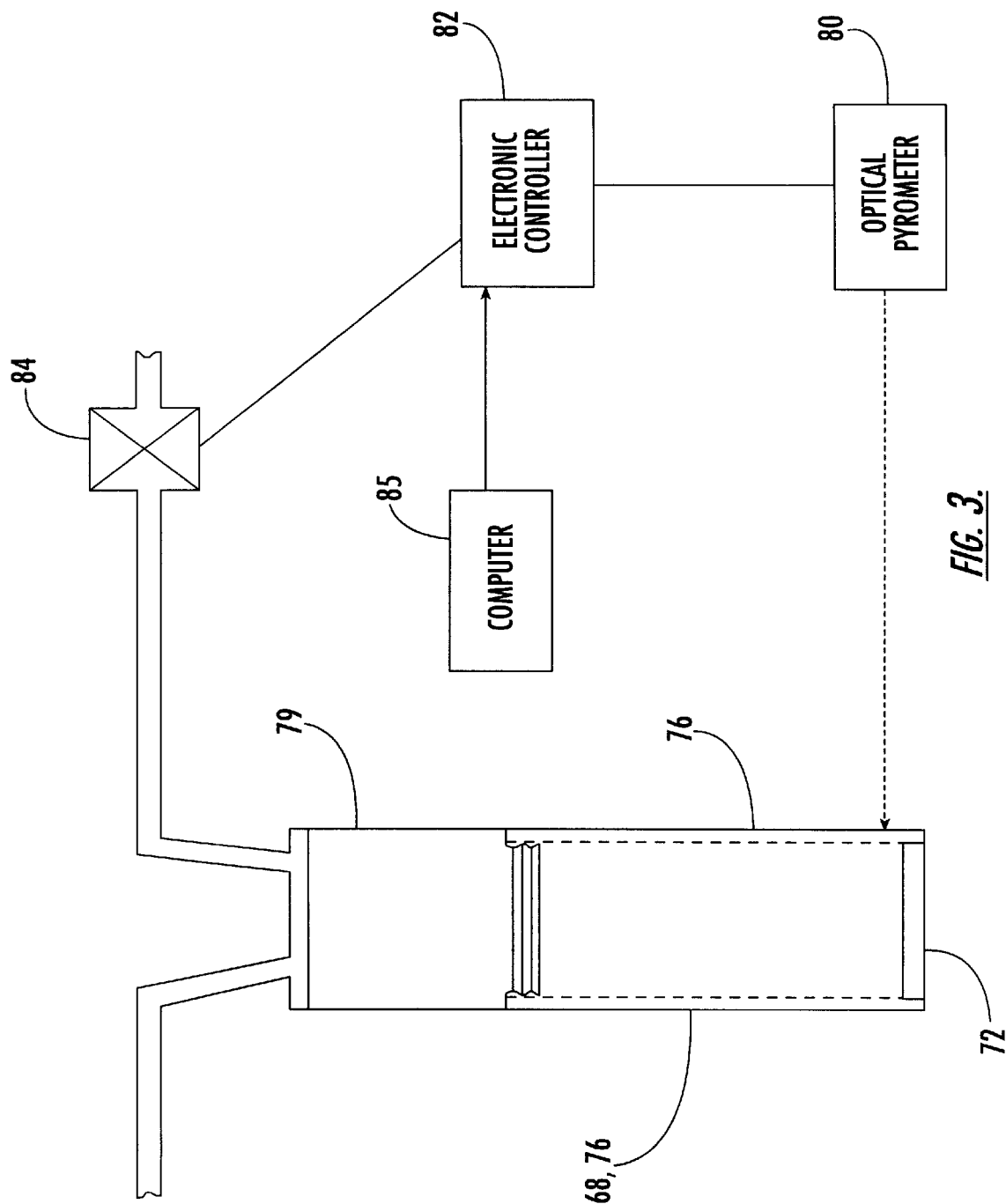
FIG. 3 is a simplified depiction of the thermal sink of the central subassembly of FIG. 2 shown in conjunction with a schematic representation of the closed loop temperature control system for the crystal interface.

Referring to FIG. 3, further details of the seed cooling system are shown. In this regard, rod 76 is connected to a water-cooled stainless steel rod 79. Water flow through stainless steel rod 79 and rod 76 is adjusted to maintain the desired seed temperature as read by an optical pyrometer 80. Preferably, this system is automated by inputting the signal from optical pyrometer 80 to electronic controller 82 linked electronically to a valve 84 controlling the water flow to the thermal heat sink. The controller 82 receives its command from a computer 85 that includes a look-up table in ROM or other suitable memory location. The look-up table is created from empirically derived data representative of the extent to which the temperature at the point read by optical pyrometer 80 must decrease over the crystal growth cycle in order to maintain a constant temperature at the crystal interface as the growing crystal interface moves closer to the source. Thus, the heat transfer rate of the thermal sink is increased during the crystal growth cycle as necessary to maintain a constant temperature at the growing crystal interface.

Referring to FIG. 1, system 10 provides a mechanism 95 (shown schematically) for rotating the seed crystal about a vertical axis during the crystal growth cycle in order to dampen the effect of thermal discontinuities in the heating element and provide a uniform thermal profile across the growing crystal interface. In this regard, the structure of the central subassembly 20 of FIGS. 1 and 2 permits the crucible 90, which is secured to the thermal sink 67, to be suspended within chamber 30 so that the crucible bottom is a selected distance above the flat heating element 52, in one embodiment approximately 2 mm above. To this end, the thermal sink is supported by the top of chamber 30 at 98 and is rotatable by mechanism 95, preferably a stepping motor. Thus, the bottom of crucible 90 rotates above heating element 52 so that thermal discontinuities in heat transfer from the heating element to the crucible are dampened out.

Preferably subassembly 20 also includes a pulling mechanism that raises the crystal as it grows, thereby maintaining the growing crystal interface in the same relative position throughout the growth cycle. To this end, crucible 90 is fixedly supported within the growth chamber by an outer sleeve, while the thermal sink and seed are suspended from the top of the chamber. Thus, the thermal sink and seed are detached from the crucible so that they may be pulled upwardly (arrow P) at a rate corresponding to the rate at which the crystal grows. The pulling of the seed may be accomplished by a closed loop control coupled to a stepping motor. As an alternative, the growth rate may be calculated or estimated from observed historical growth information, with the pulling mechanism programmed to match the calculated or observed rate. When the crystal is pulled the system for controlling the temperature at the crystal growth interface may take the form of a control as illustrated in FIG. 3 without utilizing the computer. Because the optical pyrometer 80 will be directed to the same position relative to the crystal growth interface throughout the growth cycle, the sensed temperature will always directly reflect the temperature at the crystal interface without requiring the use of a computer and look-up table to correct for movement of the interface due to crystal growth.

In the system shown in FIGS. 1 and 2, Si source vapor produced by heating liquid Si to a specific temperature is combined with C source vapor in growth crucible 90 to produce the desired flow and stoichiometry of source vapor. The area inside the growth crucible near the growing crystal interface provided by seed crystal 72 becomes saturated with Si and C that react to form single crystalline SiC at the growing crystal interface. As mentioned above, the liquid Si is contained in lower crucible 160 that if required, as in the case of a cold crucible, may be electrically insulated by a BN insulator ring, or a physical gap, or other suitable means. Crucible 160 may be a cold crucible, for example, a water-cooled copper crucible the contents of which is heated by a water-cooled induction heating coil 162 as shown in FIG. 2. Alternatively, crucible 160 may be formed of high density graphite, pyrolytic graphite, silicon carbide coated graphite, aluminum oxide, zirconium oxide or boron nitride. These crucibles may be heated by either resistance heating or induction heating, as appropriate. The C containing source gas is introduced through gas injector 170. In one embodiment, the C containing source gas is CN that is transported in an appropriate carrier gas such as $N_2$. The flow of the C containing source gas is achieved by an appropriate apparatus such as, in the case of CN, utilizing a thermal mass controller 165 that controls the flow of $N_2$ across paracyanogen at an elevated temperature (e.g. >850° C.) so that a desired flow of CN in $N_2$ is produced. The CN may be obtained by vaporizing other CN containing compounds such as tetracyanoethylene or hexacyanobutadiene.

In addition, other CN containing compounds such as $CN_2$ and $C_xN$, where X is 2 to 13, may be used as the solid source of CN gas. The liquid Si is maintained at a temperature sufficient to create a suitable vapor flow under the conditions maintained in the crucible, particularly crucible pressure. Preferably, conduit 175 includes a horizontal baffle plate 190 above the liquid Si to facilitate introduction of Si source vapor into growth crucible 90. More particularly, horizontal baffle plate 190, containing a central opening 192, extends across the flow passage through which the Si source vapor flows to create a pressure gradient thereacross and a resultant velocity increase to the Si vapor moving into crucible 90. This arrangement serves to reduce the back diffusion of CN or other gases toward the liquid Si, while also serving to propel the Si source vapor toward the growing crystal interface.

The pressure maintained in crucible 150 is largely a function of the vapor pressure of Si at the crucible temperature. This vapor pressure should be greater than the pressure maintained in crucible 90 to encourage Si vapor flow to crucible 90. Furthermore, the C containing gas introduced by injector 170 should have sufficient velocity to encourage the C containing gas to flow into the bottom of crucible 90. In this regard, a cylindrical heater 180 may be used so that conduit 175 may be maintained at a temperature above that of crucible 150, but well below the temperature at the bottom of crucible 90. Thus, when the Si and C vapors enter crucible 90 they are immediately exposed to a greatly elevated temperature that encourages reaction and the formation of vapor species appropriate for crystal growth.

FIG. 2 schematically shows an effusion system that is used to sweep impurity atoms/molecules and non-stoichiometric vapor constituents in the vapor away from the growing crystal interface, while also venting excess carrier gas (e.g. $N_2$) from the crucible. The effusion system includes effusion outlet openings 200 that, in the case of the system described above using injected $CN+N_2$ gas, carry the effused gases to an Fe gettering furnace 210. Because of the system's ability to provide high Si and C source vapor flows to crucible 90, a relatively high effusion rate may be employed while still maintaining desired saturation levels in crucible 90. Further details of various effusion systems that may be employed are set forth in applicant's application Ser. No. 08/730,882, filed Oct. 17, 1996, now U.S. Pat. No. 5,858,086, the contents of which are incorporated herein by reference in entirety.

Figure 4:
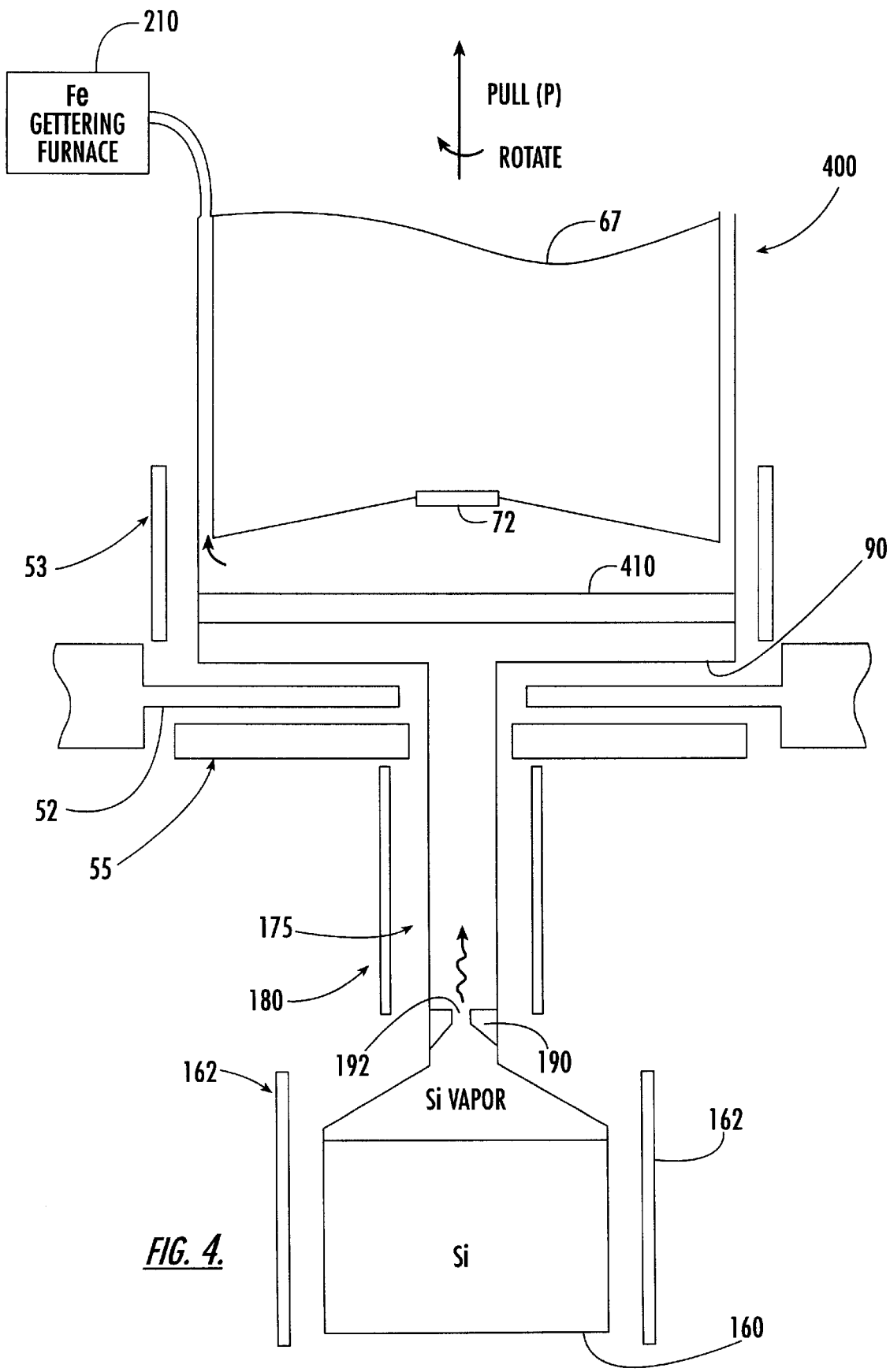
FIG. 4 is a view similar to FIG. 2 but showing a system where the carbon vapor species are provided by a solid source through which the Si source vapor flows, such as porous graphite or a bed of graphite particles.

FIG. 4 shows a system 400 that is similar to that of FIG. 2 but with the C vapor species being provided by a C containing solid source 410 in crucible 90 through which or over which the Si source vapor flows. According to this embodiment, no C containing source gas needs to be introduced into the system. The solid source 410 preferably is a gas permeable medium such as porous graphite or a bed of graphite particles of relatively large grain size, e.g., approximately 3 mm to 5 mm diameter. Operation of system 400 is particularly well suited to the production of pure bulk single crystals of SiC that may be grown for various uses, especially as the synthetic material from which SiC gemstones may be fashioned in accordance with the principles of U.S. Pat. No. 5,723,391, the contents of which are incorporated herein by reference in entirety. More particularly, the availability of ultrapure Si melt material and ultrapure graphite particles make it possible to produce very pure SiC crystals, for example 6H SiC crystals, that, in intrinsic form, are colorless to the degree necessary to serve as simulated diamonds. Where colorless material is not necessary, the C containing solid source 410 may take the form of a bed of particles of $CN_2$ or $C_xN$, where X is 2 to 13.

EXAMPLE I

Bulk single crystalline SiC is grown in system 10 of FIGS. 1–3 using a pure Si liquid to provide the Si source vapor and a $CN+N_2$ gas to provide the C source vapor.

A 1.50 inch diameter 1.0 mm thick single crystalline 6H SiC seed is placed in the bottom of the high density graphite thermal sink tube 68 and secured in place by pressure exerted through the thermal sink rod.

The effusion system components are properly positioned in the crucible and the high density graphite outer sleeve is screwed into place. The entire apparatus is then loaded into the crystal growth furnace chamber 30. After sealing the chamber, the system is pumped down to $10^{-3}$ torr with the mechanical vacuum pump in a linear ramp of 20 minutes. The turbomolecular pump is used to reduce the chamber pressure to $10^{-5}$ torr in 30 minutes. The growth chamber is back filled with high purity $N_2$ to a pressure of 760 torr. Crucible 90 is then heated to a temperature of 300° C. Next, the growth chamber is pumped down to a pressure of $10^{-3}$ torr. The system is then back filled with high purity $N_2$ to a pressure of 1,000 torr.

The pressure is held constant at 1,000 torr by throttling gas through the magnetic control valve while the bottom temperature of crucible 90, as measured by the optical pyrometer, is increased from 300° C. to 2300° C. in a linear ramp over 2 hours and 15 minutes.

Next, the system pressure is reduced to 0.3 torr in a linear ramp over 30 minutes. The seed temperature, as measured by the optical pyrometer, is held at 2105° C. by adjusting the water flow to the thermal sink.

Lower crucible 160 has been heated to 1650° C. to produce a Si vapor pressure therein on the order of one torr. Si vapor flows through conduit 175 to crucible 90 where the pressure is maintained at approximately 0.4 torr.

Next, a 95% $N_2$/5% CN gas is flowed at a total rate of 130 standard cubic centimeters per minute into gas injectors 170 and 124 via an MKS Instruments mass flow controller.

Finally, the vertical raise/lower mechanism is set to pull the seed up at a rate of 2.1 mm per hour.

The system is then held in this configuration for 24 hours with effusion directed to Fe gettering furnace 210. Next, the temperature at the bottom of crucible 90 is reduced from 2300° C. to 1200° C. in a linear ramp over a period of 1 hour and 30 minutes. The system is then back filled with nitrogen to a pressure of 760 torr in a linear ramp over a period of 1 hour as the power to the heating elements is reduced to zero in a linear ramp at the same time. After two hours the crucible is then removed from the crystal growth chamber. The resulting nitrogen doped SiC single crystal is two inches in diameter, 46–50 mm in height and n type.

EXAMPLE II

Bulk single crystalline SiC is grown in system 400 of FIG. 4 using a pure Si liquid to provide the Si source vapor and a bed of pure graphite particles 410 to provide the C source vapor.

A 1.50 inch diameter 1.0 mm thick single crystalline 6H SiC seed is placed in the bottom of the high density graphite thermal sink tube 68 and secured in place by pressure exerted through the thermal sink rod.

The effusion system components are properly positioned in the crucible and the high density graphite outer sleeve is screwed into place. The entire apparatus is then loaded into the crystal growth furnace chamber 30. After sealing the chamber, the system is pumped down to $10^{-3}$ torr with the mechanical vacuum pump in a linear ramp of 20 minutes. The turbomolecular pump is used to reduce the chamber pressure to $10^{-5}$ torr in 30 minutes. The growth chamber is back filled with high purity argon to a pressure of 760 torr. Crucible 90 is then heated to a temperature of 300° C. Next, the growth chamber is pumped down to a pressure of $10^{-3}$ torr. The system is then back filled with high purity argon to a pressure of 1,000 torr.

The pressure is held constant at 1,000 torr by throttling gas through the magnetic control valve while the bottom temperature of crucible 90, as measured by the optical pyrometer, is increased from 300° C. to 2300° C. in a linear ramp over 2 hours and 15 minutes.

Next, the system pressure is reduced to 0.3 torr in a linear ramp over 30 minutes. The seed temperature, as measured by the optical pyrometer, is held at 2105° C. by adjusting the water flow to the thermal sink.

Lower crucible 160 has been heated to 1650° C. to produce a Si vapor pressure therein on the order of one torr. Si vapor flows through conduit 175 to crucible 90 where the pressure in maintained at approximately 0.4 torr. The Si vapor flows through the bed of graphite particles to produce the necessary vapor species.

Finally, the vertical raise/lower mechanism is set to pull the seed up at a rate of 1.2 mm per hour.

The system is then held in this configuration for 24 hours with effusion directed to Fe gettering furnace 210. Next, the temperature at the bottom of crucible 90 is reduced from 2300° C. to 1200° C. in a linear ramp over a period of 1 hour and 30 minutes. The system is then back filled with argon to a pressure of 760 torr in a linear ramp over a period of 1 hour as the power to the heating elements is reduced to zero in a linear ramp at the same time. After two hours the crucible is then removed from the crystal growth chamber. The resulting SiC single crystal is two inches in diameter and 28–32 mm in height and is colorless to the extent necessary to serve as a diamond substitute material for use in gemstone applications.

In describing the techniques that are used to grow bulk single crystalline SiC at a growing crystal interface according to this invention, the terms "depositing", "depositing vapor species" and like terms will sometimes be used.

While the Si from which the Si source vapors are produced has been described as being liquid, it will be appreciated that under certain pressure and temperature the Si may be vaporized from solid form.

It will be appreciated that under certain temperature and pressure conditions $C_2N_2$ may be more stable than CN. Thus, when the terms "CN containing gas", "CN containing source gas", and like terms are used herein, they also refer to gases containing $C_2N_2$.

While the present invention has been described in connection with certain illustrated embodiments, it will be appreciated that modifications may be made without departing from the true spirit and scope of the invention.

That which is claimed:

1. A method of producing bulk single crystalline SiC comprising:

vaporizing Si to produce Si source vapor;

introducing the Si source vapor into a crystal growth enclosure containing a crystal growth interface;

introducing a CN containing gas into the crystal growth enclosure to provide carbon vapor species; and depositing vapor species of Si and C on the crystal growth interface under conditions dictating the growth of bulk single crystalline SiC thereon.

2. The method of claim 1 including the step of vaporizing the Si at a temperature in the range from about 1100° C. to 2200° C.

3. The method of claim 1 wherein the crystal growth interface comprises a SiC seed crystal.

4. The method of claim 1 including the step of providing the CN containing gas with an $N_2$ carrier gas.

5. The method of claim 1 including the step of providing the CN containing gas by vaporizing a CN containing compound.

6. The method of claim 5 wherein the CN containing compound is selected from the group consisting of paracyanogen, tetracyanoethylene, hexacyanobutiene, $CN_2$ and $C_xN$ where X is 2 to 13.

7. The method of claim 1 including the step of providing effusion of the crystal growth interface and transporting the effused gas to a gettering furnace.

8. A method ot producing bulk single crystalline SiC comprising:

vaporizing Si to produce Si source vapor;

introducing the Si source vapor into a crystal growth enclosure containing a crystal growth interface;

providing carbon vapor species in the crystal growth enclosure by flowing the Si source vapor over or through a carbon containing solid material; and depositing vapor species of Si and C on the crystal growth interface under conditions dictating the growth of bulk single crystalline SiC thereon.

9. The method of claim 8 wherein the carbon containing solid material comprises porous graphite.

10. The method of claim 8 wherein the carbon containing solid material comprises a bed of graphite particles.

11. The method of claim 8 wherein the carbon containing solid material comprises a bed of particles selected from the group consisting of $CN_2$ and $C_xN$, where X is 2 to 13.

12. A method of producing n type bulk single crystalline SiC comprising:

vaporizing Si to produce Si source vapor;

introducing the Si source vapor into a crystal growth enclosure containing a crystal growth interface;

introducing source gas including CN into the crystal growth enclosure to provide C vapor species and N dopant atoms; and depositing vapor species of Si and C on the crystal growth interface under conditions dictating the growth of bulk single crystalline SiC thereon while incorporating N atoms into the crystal as dopant atoms.

13. The method of claim 12 including the step of introducing the CN source gas with an $N_2$ carrier.

14. The method of claim 12 including the step of providing the source gas including CN by vaporizing a CN containing compound.

15. The method of claim 13 wherein the source gas including CN is selected from the group consisting of paracyanogen, tetracyanoethylene, hexacyanobutiene, $CN_2$ and $C_xN$ where X is 2 to 13.

* * * * *